United States Patent (10) Patent No.: US 8,780,664 B2
Choi (45) Date of Patent: *Jul. 15, 2014

(54) SEMICONDUCTOR MEMORY DEVICE WITH SENSE AMPLIFIER AND BITLINE ISOLATION

(71) Applicant: Mosaid Technologies Incorporated, Ottawa (CA)

(72) Inventor: Byoung Jin Choi, Kanata (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/912,650

(22) Filed: Jun. 7, 2013

(65) Prior Publication Data

US 2013/0265839 A1 Oct. 10, 2013

Related U.S. Application Data

(63) Continuation of application No. 13/040,324, filed on Mar. 4, 2011, now Pat. No. 8,462,573.

(60) Provisional application No. 61/353,437, filed on Jun. 10, 2010.

(51) Int. Cl.
 *G11C 7/00* (2006.01)
(52) U.S. Cl.
 USPC .......................... 365/222; 365/190; 365/205
(58) Field of Classification Search
 USPC ........................................................ 365/222
 See application file for complete search history.

(56) References Cited

U.S. PATENT DOCUMENTS

| 4,792,922 A | 12/1988 | Mimoto et al. |
| 5,148,399 A | 9/1992 | Cho et al. |
| 5,278,799 A | 1/1994 | Uesugi |
| 5,280,452 A | 1/1994 | Dhong et al. |
| 5,367,481 A | 11/1994 | Takase et al. |
| 5,475,642 A | 12/1995 | Taylor |
| 5,636,170 A | 6/1997 | Seyyedy |

(Continued)

FOREIGN PATENT DOCUMENTS

| JP | 04-030388 | 2/1992 |
| JP | 2002025268 A | 1/2002 |
| JP | 2002-208276 | 7/2002 |

OTHER PUBLICATIONS

International Search Report mailed on May 9, 2011 in connection with International Patent Application Serial No. PCT/CA2011/000242, 3 pages.

(Continued)

*Primary Examiner* — Son Mai

(57) ABSTRACT

A semiconductor memory device, including: a memory cell connected to a first bitline and associated with a second bitline; a sense amplifier, including a first input/output node and a second input/output node; and an isolator connected to the bitlines and to the input/output nodes, the isolator being configured to carry out bitline isolation during a refresh operation of the memory cell, where the bitline isolation includes electrically disconnecting the first bitline from the first input/output node and electrically disconnecting the second bitline from the second input/output node, followed by: electrically re-connecting the first bitline to the first input/output node while the second bitline remains electrically disconnected from the second input/output node.

18 Claims, 7 Drawing Sheets

(56) References Cited

U.S. PATENT DOCUMENTS

| | | |
|---|---|---|
| 5,936,898 A | 8/1999 | Chi |
| 6,061,278 A | 5/2000 | Kato et al. |
| 6,272,059 B1 | 8/2001 | Ryu et al. |
| 6,301,175 B1 | 10/2001 | Seyyedy et al. |
| 6,667,922 B1 | 12/2003 | Camacho et al. |
| 6,920,074 B2 | 7/2005 | Fischer et al. |
| 7,366,047 B2 | 4/2008 | Bowyer et al. |
| 7,420,862 B2 | 9/2008 | Hummler |
| 7,492,658 B2 | 2/2009 | Oh |
| 7,505,343 B2 | 3/2009 | Kang |
| 7,535,785 B2 | 5/2009 | Kim |
| 8,116,157 B2 | 2/2012 | Bruennert et al. |
| 8,462,573 B2 * | 6/2013 | Choi .............................. 365/222 |
| 2002/0085428 A1 | 7/2002 | Kang et al. |
| 2004/0223396 A1 | 11/2004 | Nakamura et al. |
| 2007/0195626 A1 | 8/2007 | Kim et al. |
| 2008/0291762 A1 | 11/2008 | Kajigaya |

OTHER PUBLICATIONS

Written Opinion of the International Searching Authority mailed on May 9, 2011 in connection with International Patent Application Serial No. PCT/CA2011/000242, 4 pages.

Non-Final Office Action issued by the United States Patent and Trademark Office on Oct. 24, 2012 in connection with U.S. Appl. No. 13/040,324, 9 pages.

ISCA Tutorial: Low Power Design, Memories.8, MJI&VN, PSU, 2000, 28 pages.

* cited by examiner

SEMICONDUCTOR MEMORY DEVICE WITH SENSE AMPLIFIER AND BITLINE ISOLATION

CROSS-REFERENCE TO RELATED APPLICATION

The present application is a continuation and claims the priority benefit of U.S. patent application Ser. No. 13/040,324, filed on Mar. 4, 2011, which claims the priority benefit of U.S. Provisional Patent Application Ser. No. 61/353,437, filed on Jun. 10, 2010. The disclosures of each of the aforementioned applications are expressly incorporated herein by reference in their entireties.

TECHNICAL FIELD

The present invention relates generally to semiconductor memory devices and, more particularly, to a dynamic random access memory (DRAM) device with a sense amplifier and bitline isolation.

BACKGROUND

Today's mobile phones, laptops, tablet computers, game consoles, set-top boxes, GPS units and other electronics require random access memory. One form of random access memory is dynamic random access memory (DRAM), which is often used because of its high memory density (number of bits stored per unit area or volume).

Examples of background art that describe DRAM devices include U.S. Pat. No. 5,148,399 granted to Cho et al. on Sep. 15, 1992, entitled "Sense Amplifier Circuitry Selectively Separable From Bit Lines For Dynamic Random Access Memory", and U.S. Pat. No. 7,505,343 granted to Kang on Mar. 17, 2009, entitled "Sense Amplifier Circuit In Semiconductor Memory Device And Driving Method Thereof".

Cho et al. disclose an integrated circuit memory device that includes a sense amplifier circuit having a first transistor coupling section connected between a pair of bitlines and a pair of sense amplifier nodes. The sense amplifier circuit further includes a first sense amplifier connected between the sense amplifier nodes so as to selectively discharge one of the sense amplifier nodes and a second sense amplifier connected between the sense amplifier nodes so as to selectively charge the other one of the sense amplifier nodes.

Kang discloses a sense amplifier circuit in a semiconductor memory device in which an under-drive is applied to a switching element of a pull-down side of a sense amplifier in order to compensate for poor driving capability in the case of performing a low voltage operation. The sense amplifier circuit includes: a sense amplifier which has a pull-down element composed of an NMOS transistor and a pull-up element composed of a PMOS transistor and is formed between bitlines to perform data exchange; and a drive controller which supplies a drive voltage for the use of pull-up and pull-down operations to the sense amplifier in order to perform the data exchange, and, during a specific time period included in a time for providing the drive voltage, performs an under-drive whereby the drive voltage for the use of the pull-down operation is used so that the sense amplifier is provided with a voltage that is lower than a voltage used in the pull-down operation in a normal state.

One feature of DRAM devices such as those of Cho et al. and Kang is that they must be refreshed in order to retain the data stored therein. Refreshing of the data occurs frequently and consumes power. This can be an issue for battery-operated units such as mobile phones and laptop/tablet computers. Therefore, it would be beneficial to devise power efficient methods and apparatus for refreshing the data stored in a DRAM device.

SUMMARY

According to a first broad aspect, embodiments of the present invention seek to provide a semiconductor memory device, including: a memory cell connected to a first bitline and associated with a second bitline; a sense amplifier, including a first input/output node and a second input/output node; and an isolator connected to the bitlines and to the input/output nodes, the isolator being controllable during a refresh operation of the memory cell to cause the first bitline to be electrically connected to or disconnected from the first input/output node and, independently, to cause the second bitline to be electrically connected to or disconnected from the second input/output node.

According to a second broad aspect, embodiments of the present invention seek to provide a semiconductor memory device, including: a memory cell connected to a first bitline and associated with a second bitline; a sense amplifier, including a first input/output node and a second input/output node; and an isolator connected to the bitlines and to the input/output nodes, the isolator being configured to carry out bitline isolation during a refresh operation of the memory cell, where the bitline isolation includes electrically disconnecting the first bitline from the first input/output node and electrically disconnecting the second bitline from the second input/output node, followed by: electrically re-connecting the first bitline to the first input/output node while the second bitline remains electrically disconnected from the second input/output node.

According to a third broad aspect, embodiments of the present invention seek to provide a semiconductor memory device, including: a memory cell connected to a first bitline and associated with a second bitline; a sense amplifier, including a first input/output node and a second input/output node; and an isolator connected to the bitlines and to the input/output nodes, the isolator being configured to carry out bitline isolation during a refresh operation of the memory cell, wherein the bitline isolation includes electrically disconnecting the second bitline from the second input/output node while the first bitline remains electrically connected to the first input/output node.

According to a fourth broad aspect, embodiments of the present invention seek to provide a method of refreshing a memory cell connected to a first bitline and associated with a second bitline, the method including: connecting the first bitline to a first input/output node of a sense amplifier and connecting the second bitline to a second input/output node of the sense amplifier; triggering charge sharing between the memory cell and the first bitline; disconnecting the first bitline from the first input/output node and disconnecting the second bitline from the second input/output node; activating the sense amplifier to initiate a signal amplification process at the first and second input/output nodes; and re-connecting the first bitline to the first input/output node while the second bitline remains disconnected from the second input/output node.

According to a fifth broad aspect, embodiments of the present invention seek to provide a method of refreshing a memory cell connected to a first bitline and associated with a second bitline, the method including: connecting the first bitline to a first input/output node of a sense amplifier and connecting the second bitline to a second input/output node of the sense amplifier; triggering charge sharing between the memory cell and the first bitline; disconnecting the second bitline from the second input/output node while the first bitline remains connected to the first input/output node; and activating the sense amplifier to initiate a signal amplification process at the first and second input/output nodes.

According to a sixth broad aspect, embodiments of the present invention seek to provide a semiconductor memory device, including a memory cell connected to a first bitline and associated with a second bitline; a sense amplifier, including a first input/output node and a second input/output node; and an isolator connected to the bitlines and to the input/output nodes. The isolator being configured to carry out bitline isolation during a refresh operation of the memory cell, wherein the bitline isolation includes electrically disconnecting the second bitline from the second input/output node, followed by electrically connecting the first bitline to the first input/output node while the second bitline remains electrically disconnected from the second input/output node, the sense amplifier being responsive to receipt of at least one sensing activation signal from a controller to initiate a signal amplification process at the first and second input/output nodes; the signal amplification process causing the first input/output node to tend towards a first final electric potential and the second input/output node to tend towards a second final electric potential different from the first final electric potential, wherein electrically disconnecting the second bitline from the second input/output node is carried out after said amplification process has been initiated but before the second input/output node has reached the second final electric potential.

Other aspects and features of the present invention will become apparent to those ordinarily skilled in the art upon review of the following description of specific embodiments of the invention in conjunction with the accompanying drawings.

BRIEF DESCRIPTION OF THE DRAWINGS

Embodiments of the present invention will now be described, by way of example only, with reference to the attached drawings, wherein.

DETAILED DESCRIPTION

In the following detailed description, reference is made to the accompanying drawings, showing by way of illustration specific sample embodiments in which the present invention may be practiced. It is to be understood that other embodiments may be utilized and that logical, mechanical, electrical, and other changes may be made without departing from the scope of the present invention. The following detailed description is, therefore, not to be taken in a limiting sense, the scope of the present invention being defined by the appended claims.

Figure 1:
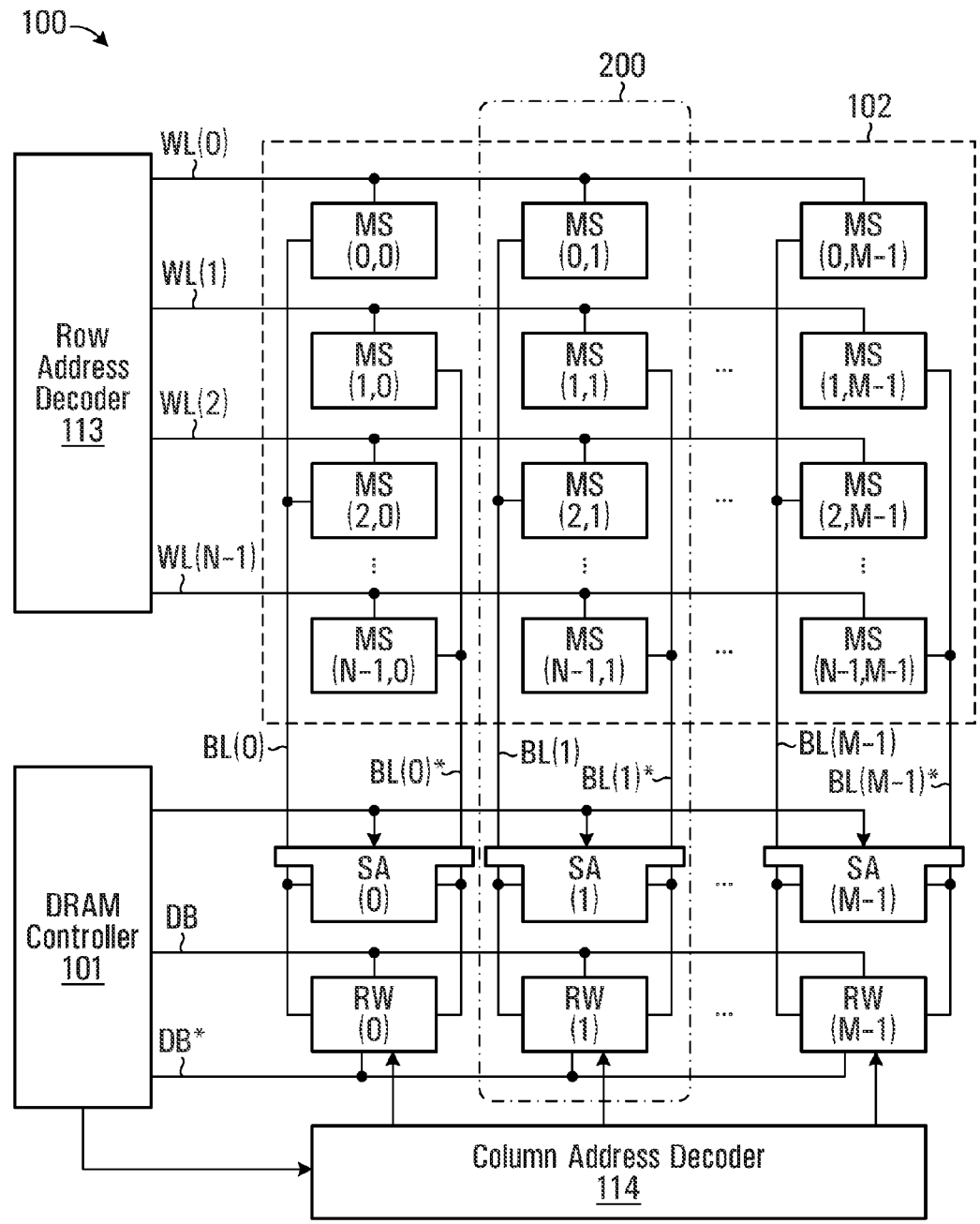
FIG. 1 is a block diagram illustrating an example of a dynamic random access memory (DRAM) device to which an embodiment of the present application is applicable.

Reference is made to FIG. 1, which shows a semiconductor memory device, in this case a dynamic random access memory (DRAM) device 100.

The DRAM device 100 includes a DRAM controller 101 and a memory array 102 comprising a set of memory cells arranged into N rows and M columns. Each memory cell can be used to store electrical charge representative of a data bit. A particular memory cell is denoted MS(x,y), where "x" (ranging from 0 to N−1) denotes the row and "y" (ranging from 0 to M−1) denotes the column in which the particular memory cell is located.

The DRAM device 100 also includes a row address decoder 113. The row address decoder 113 is connected to the DRAM controller 101, from which it receives the identity of a row in which is located a particular memory cell that is to be read from, written to or refreshed. The row address decoder 113 is connected to a plurality of wordlines WL(0), WL(1), . . . , WL(N−1). The voltage on the wordlines WL(0), WL(1), . . . , WL(N−1) can be made to vary between a first supply voltage VSS and a high positive voltage VPP. A suitable but non-limiting example value of the first supply voltage VSS is 0V, whereas a suitable but non-limiting example value of the high positive voltage VPP is 3.0V. By placing the high positive voltage VPP on a particular one of the wordlines WL(0), WL(1), . . . , WL(N−1), a corresponding row of the memory array 102 is "enabled". The effect of enabling a row of the memory array 101 will become apparent from the description below.

The DRAM device 100 also includes a column address decoder 114. The column address decoder 114 is connected to the DRAM controller 101, from which it receives the identity of a column in which is located a particular memory cell that is to be read from or written to.

The DRAM device 100 also includes a plurality of read/write circuits RW(0), RW(1), . . . , RW(M−1) and a plurality of sense amplifiers SA(0), SA(1), . . . , SA(M−1), which will now be described in greater detail below.

Within the memory array 102, a pair of bitlines runs along each particular column, and each bitline in the particular column connects alternate cells in the particular column to a corresponding read/write circuit and to a corresponding sense amplifier for that column. For example, in column 0, a "left" bitline BL(0) connects memory cells MS(0,0), MS(2,0), MS(N−2,0) to read/write circuit RW(0) and to sense amplifier SA(0), whereas a "right" bitline BL(0)* connects memory cells MS(1,0), MS(3,0), MS(N−1,0) to the same read/write circuit RW(0) and to the same sense amplifier SA(0). In a similar fashion, a "left" bitline BL(1) and a "right" bitline BL(1)* connect alternating groups of cells in column 1 to read/write circuit RW(1) and to sense amplifier SA(1). A similar interconnectivity pattern with a "left" bitline and a "right" bitline applies to the other columns of the memory array, i.e., from column 2 through column M−1. Of course, it should be understood that the terms "left" and "right" are used only for convenience and simplicity in reference to the pair of bitlines in a given column, and is not intended to confine the bitlines to a particular spatial location within an actual implementation. The "left" and "right" bitlines could indeed have been called "first" and "second" bitlines, "main" and "complementary" bitlines, "positive" and "negative" bitlines, etc.

Figure 2:
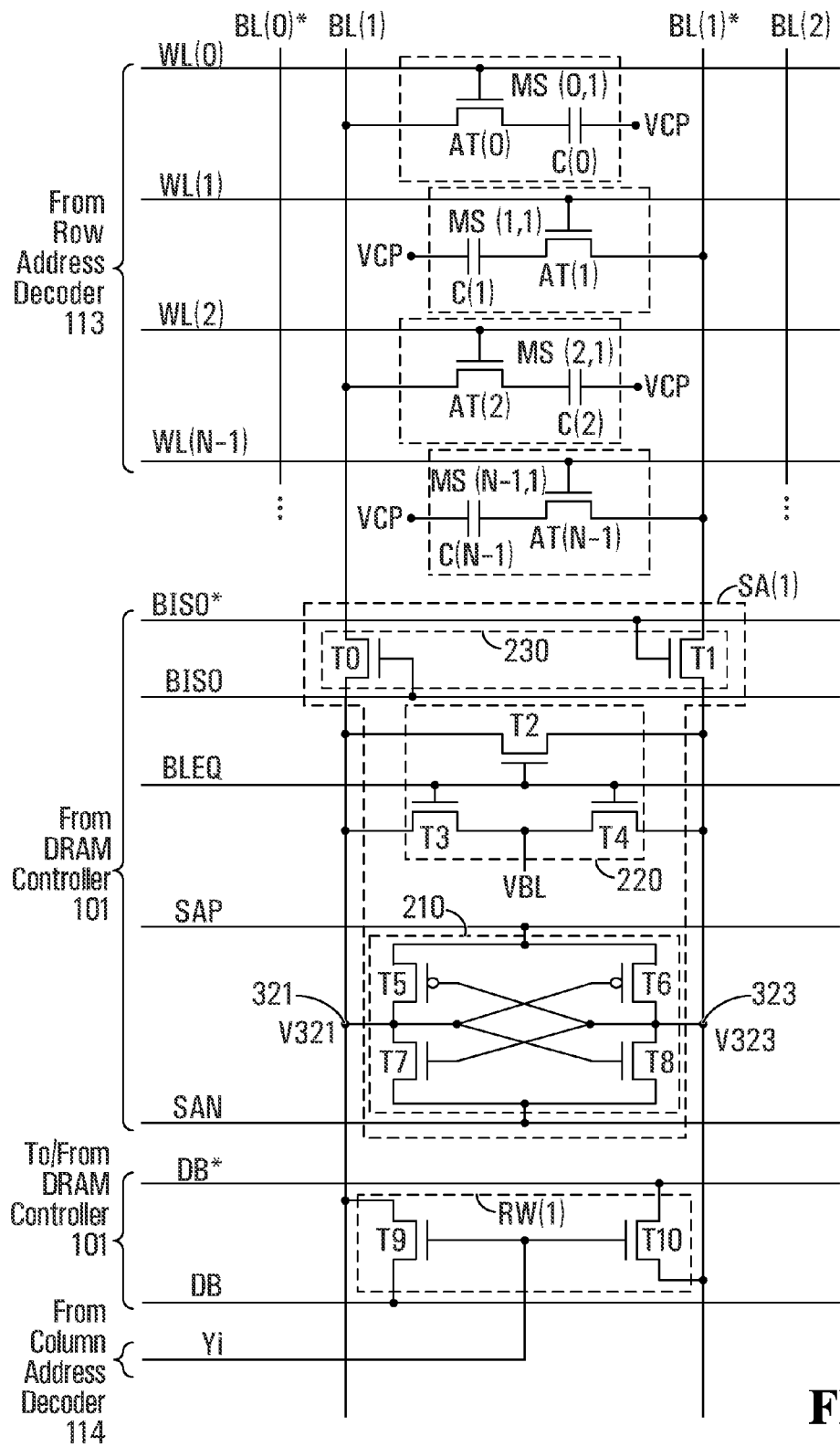
FIG. 2 is a block diagram illustrating an example of a sense amplifier, according to an embodiment of the present invention.

Reference is now made to FIG. 2, which by way of non-limiting example illustrates a portion 200 of the DRAM device 100 in FIG. 1. Specifically, the portion 200 includes memory cells MS(0,1), MS(1,1), ..., MS(N−1,1) in column 1 of the memory array 102. (It is assumed that N is an even number, but this need not be the case in every embodiment.) Also forming part of portion 200 is read/write circuit RW(1) and sense amplifier SA(1) associated with column 1 of the memory array 102. It will be recalled that the pair of bitlines connected to read/write circuit RW(1) and sense amplifier SA(1) include left bitline BL(1) and right bitline BL(1)*. The following provides a more detailed description of the elements in portion 200.

Memory cell MS(0,1) includes an access transistor AT(0) with a drain connected to left bitline BL(1) and a source connected to a charge storage capacitor C(0). Another terminal of capacitor C(0) is connected to a cell plate voltage VCP (e.g., VDD/2). Transistor AT(0) also has a gate that is connected to wordline WL(0). Similarly, memory cell MS(2,1) includes an access transistor AT(2) with a drain connected to left bitline BL(1) and a source connected to a charge storage capacitor C(2). Another terminal of capacitor C(2) is connected to the cell plate voltage VCP. Transistor AT(2) also has a gate that is connected to wordline WL(2).

The same description applies to memory cell MS(1,1), except with respect to the right bitline BL(1)*. Specifically, memory cell MS(1,1) includes an access transistor AT(1) having a drain connected to right bitline BL(1)* and a source connected to a charge storage capacitor C(1). Another terminal of capacitor C(1) is connected to the cell plate voltage VCP. Transistor AT(1) also has a gate that is connected to wordline WL(1).

Considering now operation of memory cell MS(0,1) in particular, when wordline WL(0) is enabled by the row address decoder 113, this turns on transistor AT(0), thereby electrically connecting capacitor C(0) to left bitline BL(1). In order to write a logic "1" to memory cell MS(0,1), a second supply voltage VDD is applied across capacitor C(0), whereas in order to write a logic "0" to memory cell MS(0,1), the aforementioned first supply voltage VSS is applied across capacitor C(0). A suitable but non-limiting example value of the second supply voltage VDD is 1.5V.

On the other hand, when wordline WL(0) is disabled, this turns off transistor AT(0), thereby electrically disconnecting left bitline BL(1) from capacitor C(0). This is done with the intent of keeping capacitor C(0) charged (or discharged, depending on the value of the data bit written to memory cell MS(0,1)). However, charge will dissipate from (or into) capacitor C(0) after a relatively short period of time and therefore the original charged or discharged state of capacitor C(0) needs to be periodically reapplied to capacitor C(0). This is the purpose of a "refresh" operation, which should regularly and frequently if one wishes the correct data bit to be accessible by reading memory cell MS(0,1) at some future time. The maximum amount of time allowable between refresh operations without risk of data error on a subsequent read operation is determined by the charge storage capabilities of capacitor C(0). In the industry, it is not unusual to specify the time between refresh operations (i.e., the "refresh period") to be on the order of 64 milliseconds.

Read/write circuit RW(1) includes NMOS transistors T9 and T10. Each of the transistors T9 and T10 has a gate, a source and a drain. The drain of transistor T9 is connected to left bitline BL(1) and the source of transistor T9 is connected to a first data line DB. The drain of transistor T10 is connected to a second data line DB* and the source of transistor T10 is connected to right bitline BL(1)*. The first data line DB and the second data line DB* are similarly connected through to the other sense amplifiers SA(0), SA(2), SA(3), ..., SA(M−1). A column address line Yi, supplied by the column address decoder 114, is connected to the gates of transistors T9 and T10. The voltage on the column address line Yi can be made to vary between the first supply voltage VSS and the second supply voltage VDD.

Turning now to sense amplifier SA(1), this component includes a sense amplifier circuit 210, a bitline equalizer 220 and an isolator 230. Each of these components is now described.

In a non-limiting embodiment, the sense amplifier circuit 210 includes two P-channel transistors T5, T6 and two N-channel transistors T7, T8 that are cross-coupled. The cross-coupled transistors are connected to the DRAM controller 101 via a pair of sensing activation lines SAP, SAN. The sense amplifier circuit 210 has two input/output nodes 321 and 323 that connect to the cross-coupled transistors. Specifically, each of the transistors T5, T6, T7 and T8 has a gate, a source and a drain. The source of transistor T5 is connected to the drain of transistor T7, to the gate of transistor T6, to the gate of transistor T8 and to input/output node 321. In addition, the source of transistor T6 is connected to the drain of transistor T8, to the gate of transistor T5, to the gate of transistor T7 and to input/output node 323. Also, the drain of transistor T5 is connected to the drain of transistor T6 and to sensing activation line SAP. Finally, the source of transistor T7 is connected to the source of transistor T8 and to sensing activation line SAN. The voltage on sensing activation line SAP can be made to vary between a bitline pre-charge voltage VBL and the second supply voltage VDD, whereas the voltage on sensing activation line SAN can be made to vary between the first supply voltage VSS and the aforementioned bitline pre-charge voltage VBL.

In a non-limiting embodiment, the bitline equalizer 220 comprises three N-channel transistors T2, T3 and T4. Each of the transistors T2, T3, and T4 has a gate, a source and a drain. The drain of transistor T2 is connected between left bitline BL(1) and the source of transistor T2 is connected to right bitline BL(1)*. The drain of transistor T3 is connected to left bitline BL(1) and the source of transistor T4 is connected to right bitline BL(1)*. The bitline pre-charge voltage VBL is fed to the junction where the source of transistor T3 meets the drain of transistor T4. In an embodiment, the bitline pre-charge voltage VBL is kept between the first supply voltage VSS and the second supply voltage VDD. In an embodiment, the bitline pre-charge voltage VBL is kept midway between VSS and VDD, i.e., VBL=½(VDD+VSS).

The bitline equalizer 220 is connected to the DRAM controller 101 via a bitline equalization line BLEQ. Specifically, the bitline equalization line BLEQ leads to the gates of transistors T2, T3 and T4. The voltage on the bitline equalization line can be made to vary between the first supply voltage VSS and the second supply voltage VDD, which allows switching on and off of the gates of transistors T2, T3 and T4. Consequently, the electric potential between left bitline BL(1) and right bitline BL(1)* can be equalized under control of the DRAM controller 101.

In a non-limiting embodiment, the isolator 230 can include two bitline isolation transistors, namely N-channel transistors T0 and T1. Each of the transistors T0 and T1 has a gate, a source and a drain. Transistor T0 is connected between the sense amplifier circuit 210 and left bitline BL(1), whereas transistor T1 is connected between the sense amplifier circuit 210 and right bitline BL(1)*. More specifically, the source and the drain of transistor T0 are connected to the left bitline BL(1) and to input/output node 321, respectively. Similarly, the source and the drain of transistor T1 are connected to right bitline BL(1)* and to input/output node 323, respectively.

A first bitline isolation line BIS0 connects the gate of transistor T0 to the DRAM controller 101, whereas a second bitline isolation line BIS0* connects the gate of transistor T1 to the DRAM controller 101. The voltage on each of the bitline isolation lines BIS0, BIS0* can be made to vary between the first supply voltage VSS and the high positive voltage VPP. In this way, left bitline BL(1) can be electrically disconnected from and re-connected to input/output node 321 in a controllable fashion. Similarly, right bitline BL(1)* can be electrically disconnected from and re-connected to input/output node 323. In an embodiment, the bitline isolation lines BIS0, BIS0* are controlled independently so that their respective voltages may change (i.e., rise or fall) at different times, although they can also be made to change together (simultaneously). This allows independent isolation of bitlines BL(1), BL(1)* from input/output nodes 321, 323, respectively.

The following will now describe operation of sense amplifier SA(1) under various circumstances.

Firstly, a pre-charge operation will be described. To begin with, it is assumed that wordline WL(0) is at the first supply voltage VSS and sensing activation lines SAP, SAN are at the bitline pre-charge voltage VBL. DRAM controller 101 then sets the voltage on bitline isolation line BLEQ to the second supply voltage VDD, thereby turning on transistors T2, T3 and T4. This has the effect of forcing the voltage on input/output nodes 321 and 323 to the bitline pre-charge voltage VBL. Meanwhile, the voltage on first bitline isolation line BIS0 and the voltage on second bitline isolation line BIS0* are kept at the high positive voltage VPP, thus keeping transistors T0 and T1 in a conductive state. This electrically connects left bitline BL(1) to input/output node 321 and also connects right bitline BL(1)* to input/output node 323, hence causing both the voltage on left bitline BL(1) and the voltage on right bitline BL(1)* to also be at VBL. It is recalled that in an embodiment, VBL may be midway between the first supply voltage VSS and the second supply voltage VDD. The DRAM controller 101 then sets the voltage on the bitline isolation line BLEQ to VSS, disconnecting left bitline BL(1) from right bitline BL(1)* but leaving them pre-charged.

Figure 3A:
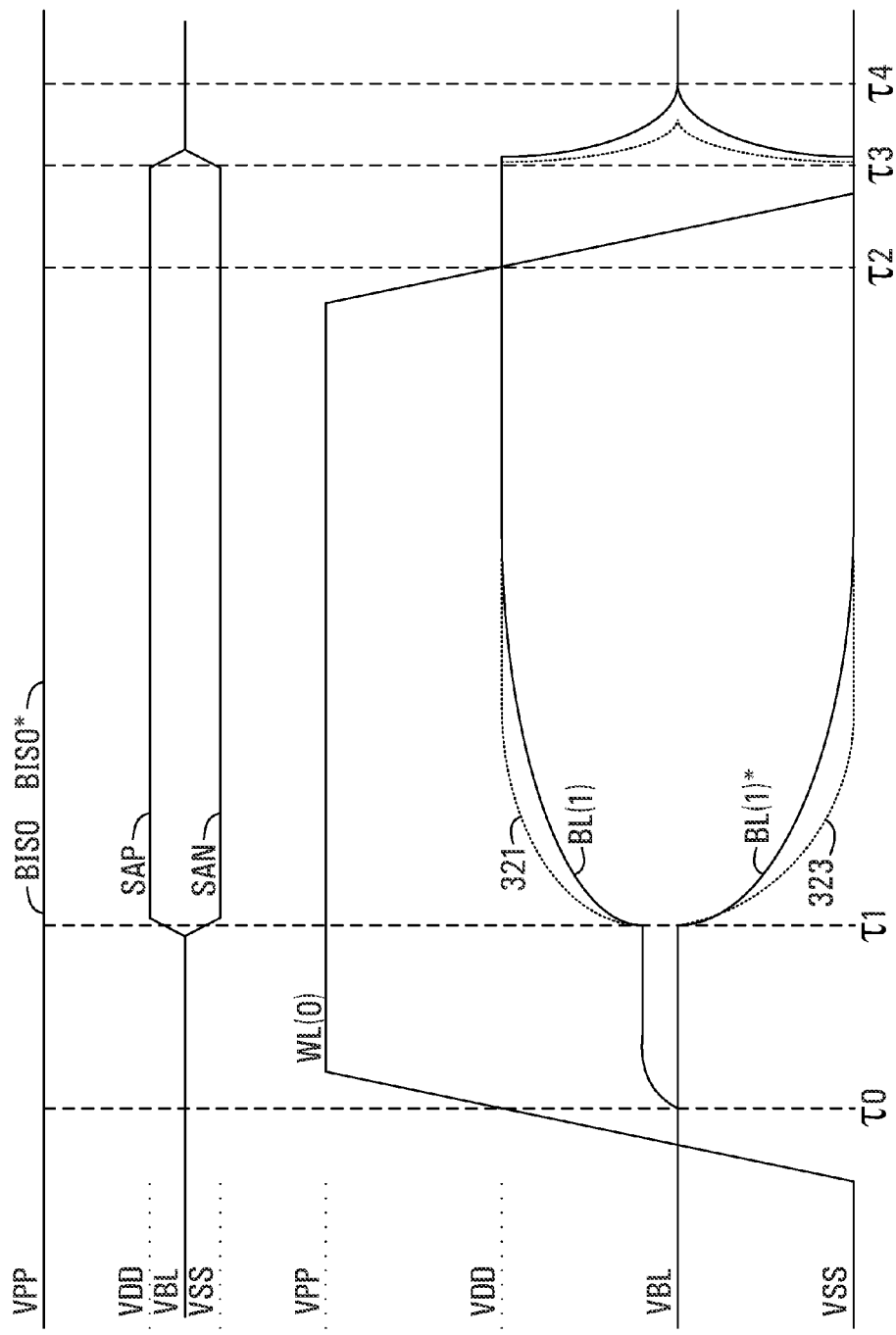
FIG. 3A is a timing diagram showing operation of the sense amplifier of FIG. 2 when performing an "auto-refresh and read" operation.

Reference is now made to FIG. 3A, which is a timing diagram showing operation of the sense amplifier SA(1) of FIG. 2 during an "auto-refresh and read" operation, following the aforementioned bitline pre-charge operation. In this case, the voltage on first bitline isolation line BIS0 and the voltage on second bitline isolation line BIS0* are kept at the high positive voltage VPP, thus effectively placing transistors T0 and T1 in a conductive state and leaving them as such throughout the "auto-refresh and read" operation.

τ0: The row address decoder 113 activates wordline WL(0) (i.e., the voltage on wordline WL(0) transitions from the first supply voltage VSS to the high positive voltage VPP). This turns on transistor AT(0) forming part of memory cell MS(0,1). As a result, charge sharing takes place between capacitor C(0) and left bitline BL(1). Meanwhile, the voltage on right bitline BL(1)* stays at the pre-charge voltage VBL. As can be seen from FIG. 3A, a small potential difference between left bitline BL(1) and right bitline BL(1)* will develop. The sign of this potential difference (i.e., positive or negative) depends on the data value of memory cell MS(0,1). Since transistors T0 and T1 remain conductive, a small potential difference will also develop between input/output node 321 and input/output node 323.

τ1: The DRAM controller 101 activates enables the sense amplifier circuit 210. Specifically, the voltage on sensing activation line SAP transitions to the second supply voltage VDD, while the voltage on sensing activation line SAN transitions to the first supply voltage VSS. This triggers operation of the sense amplifier circuit 210, by virtue of which a positive feedback mechanism is carried out by transistors T5, T6, T7 and T8. This results in amplification of the potential difference between input/output nodes 321 and 323, with the voltage at input/output node 321 rising and the voltage at input/output node 323 falling. Since transistors T0 and T1 remain conductive, the potential difference between left bitline BL(1) and right bitline BL(1)* increases as well, although with a slight lag due to the line capacitance.

After a certain amount of time, left bitline BL(1) and right bitline BL(1)* are fully developed, i.e., the voltage on left bitline BL(1) and right bitline BL(1)* has converged, in this case to VDD and VSS, respectively. This results in the second supply voltage VDD on left bitline BL(1) being applied across capacitor C(0) via transistor AT(0) (which is conducting), thereby effecting restoration of charge to memory cell MS(0,1), i.e., memory cell MS(0,1) is "refreshed".

At this stage, reading from memory cell MS(0,1) is possible by connecting left bitline BL(1) to first data line DB and by connecting right bitline BL(1)* to second data line DB*. Specifically, this is achieved by the column address decoder 114 transitioning the voltage of the column address line Yi to the second supply voltage VDD for a certain amount of time, and then latching the value of the first and second data lines DB, DB* by returning the voltage of the column address line Yi back to the first supply voltage VSS.

τ2: The row address decoder 113 de-activates wordline WL(0) (i.e., the voltage on wordline WL(0) transitions from the high positive voltage VPP to the first supply voltage VSS). This turns off transistor AT(0) forming part of memory cell MS(0,1). It is now safe to adjust the voltages on left bitline BL(1) and complementary bitline BL(1)* without fear of affecting the data content of memory cell MS(0,1).

τ3: The DRAM controller 101 de-activates sensing activation lines SAP, SAN. Specifically, the voltage on sensing activation lines SAP, SAN transitions to the bitline pre-charge voltage VBL. This quickly brings the voltage on input/output nodes 321 and 323 to VBL. Since transistors T0 and T1 remain conductive, the voltage on left bitline BL(1) and right bitline BL(1)* is similarly brought to VBL, although with a slight delay due to line capacitance. The sense amplifier SA(1) is now ready for another pre-charge operation as of τ4.

Figure 3B:
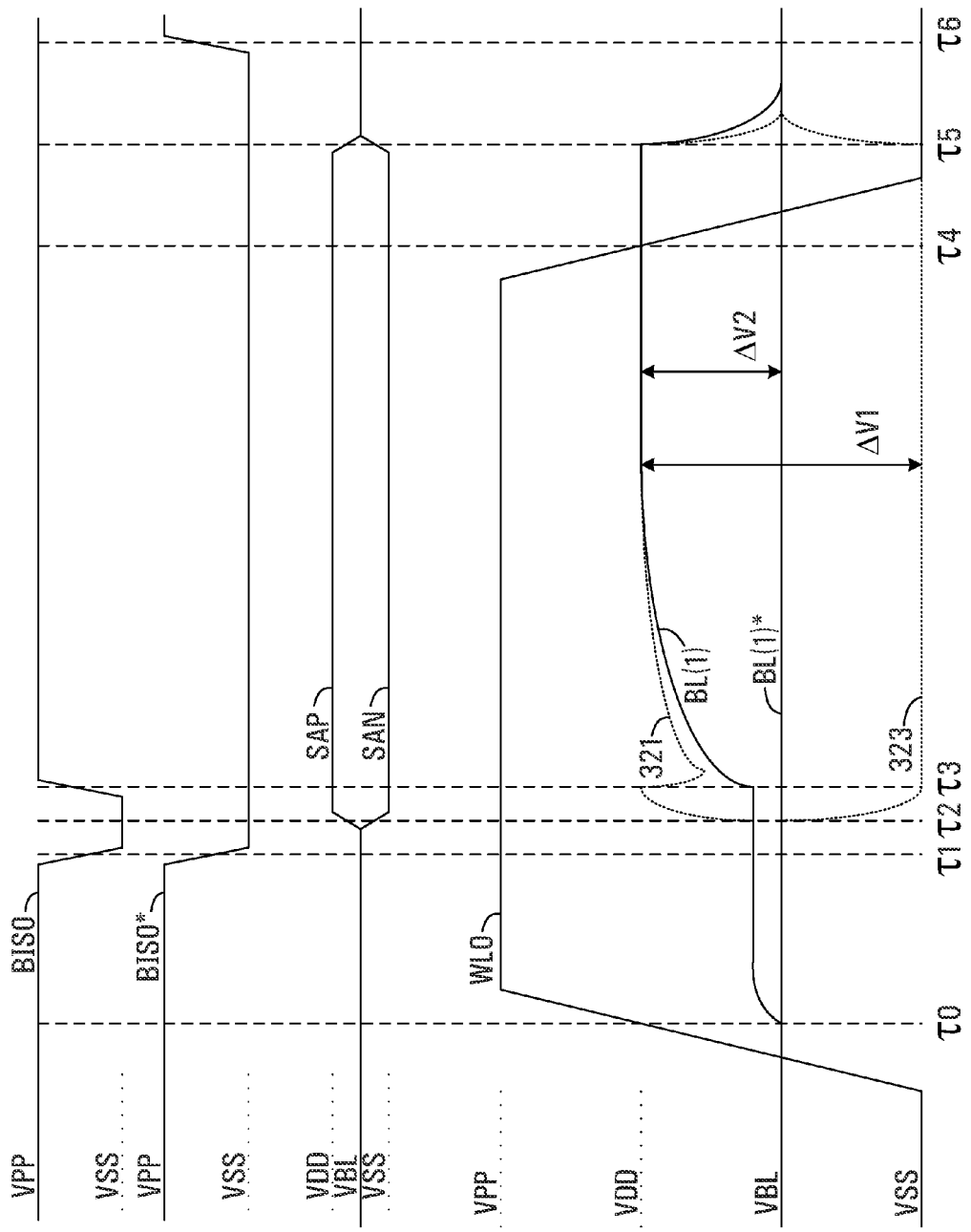
FIG. 3B is a timing diagram showing operation of the sense amplifier of FIG. 2 when performing a "self-refresh" operation, according to an embodiment of the present invention.
Figure 3C:
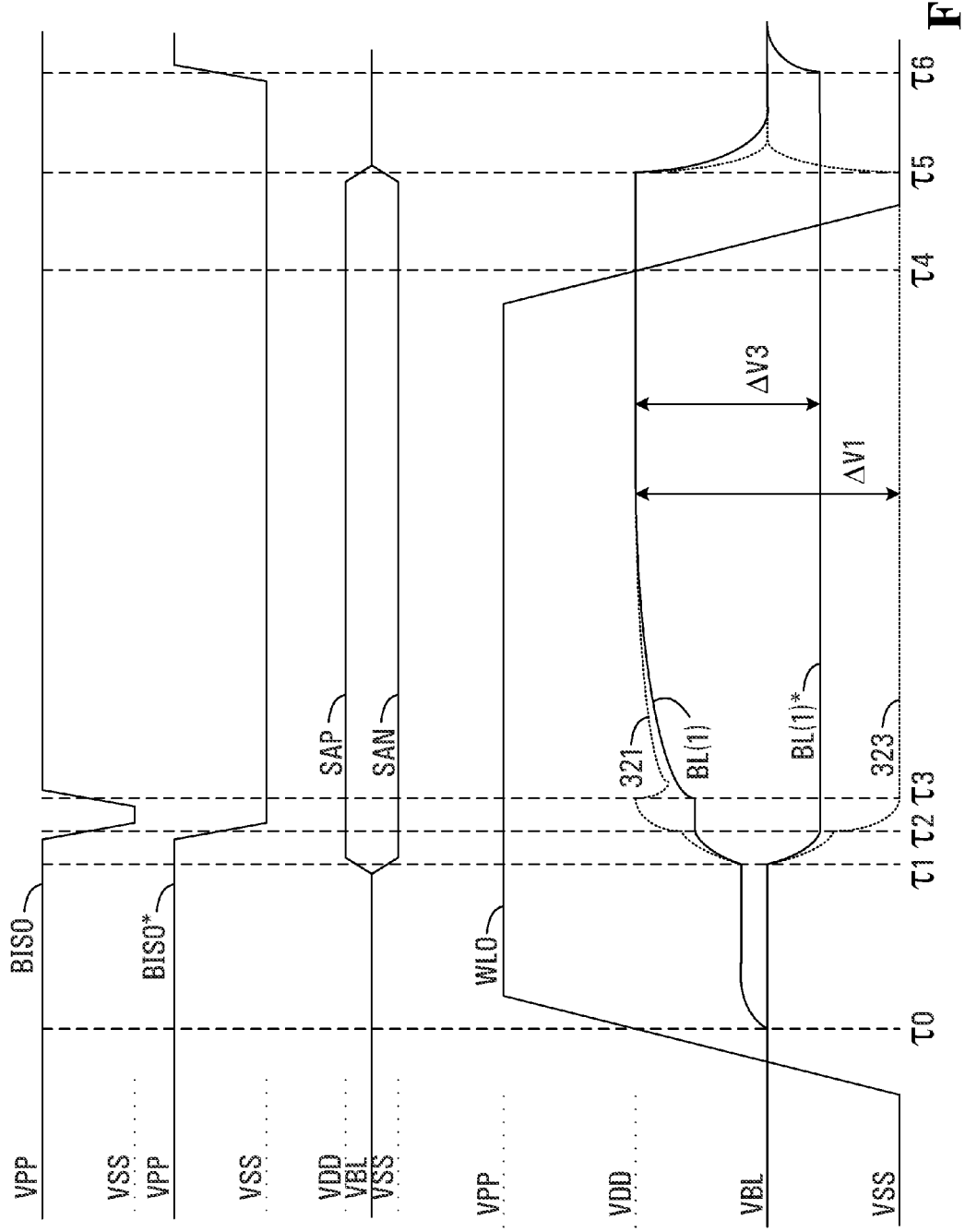
FIG. 3C is a timing diagram showing operation of the sense amplifier of FIG. 2 when performing a "self-refresh" operation, according to another embodiment of the present invention.

Reference will now be made to FIGS. 3B and 3C, which show timing diagrams of the sense amplifier SA(1) of FIG. 2 during a "self-refresh" operation. The "self-refresh" operation can be performed while the memory device 100 is in a "self-refresh" mode of operation (a minimum mode of operation entered into when the system does not operate for a long time). The "self-refresh" operation can also be performed while the memory device 100 is in an "auto-refresh and read" mode for special applications, for example low performance and/or low power operation. A command received along a command line causes the memory device 100 to enter into the "self-refresh" mode (or the low-performance/low-power "auto-refresh and read" mode). As such, the command could be indicative of an instruction to enter the appropriate mode. The command could also quite simply be indicative of an instruction to perform a "self-refresh" operation, without regard to any specific mode of operation of the memory controller 100.

In accordance with two specific non-limiting embodiments of the present invention, there will be illustrated a method of refreshing memory cell MS(0,1) connected to left bitline BL(1) and associated with right bitline BL(1)*, that will include: connecting left bitline BL(1) to input/output node 321 of sense amplifier circuit 210 and connecting right bitline BL(1)* to input/output node 323 of sense amplifier circuit 210; triggering charge sharing between memory cell MS(0,1) and left bitline BL(1); disconnecting left bitline BL(1) from input/output node 321 and disconnecting right bitline BL(1)* from input/output node 323; activating sense amplifier circuit 210 to initiate a signal amplification process at input/output nodes 321 and 323; and re-connecting direct bitline B1* to input/output node 321 while complementary bitline B1* remains disconnected from input/output node 323.

Accordingly, specific reference is now made to FIG. 3B, which is a timing diagram showing operation of the sense amplifier SA(1) of FIG. 2 during a refresh operation, following the aforementioned bitline pre-charge operation, and in accordance with a specific non-limiting embodiment of the present invention. The description begins under the assumption that the voltage on first bitline isolation line BIS0 and the voltage on second bitline isolation line BIS0* is at the high positive voltage VPP, thus initially placing transistors T0 and T1 in a conductive state.

$\tau 0$: The row address decoder 113 activates wordline WL(0) (i.e., the voltage on wordline WL(0) transitions from the first supply voltage VSS to the high positive voltage VPP). This turns on transistor AT(0) forming part of memory cell MS(0,1). As a result, charge sharing takes place between capacitor C(0) and left bitline BL(1). Meanwhile, the voltage on right bitline BL(1)* stays at the bitline pre-charge voltage VBL. As can be seen from FIG. 3B, a small potential difference between left bitline BL(1) and right bitline BL(1)* will develop. The sign of this potential difference (i.e., positive or negative) depends on the data value of memory cell MS(0,1). Since transistors T0 and T1 are in a conductive state, a small potential difference will also develop between input/output node 321 and input/output node 323.

$\tau 1$: The isolator 230 is caused to isolate left bitline BL(1) from input/output node 321 and to isolate right bitline BL(1)* from input/output node 323. This is achieved through control of the isolator 230 by the DRAM controller 101. Specifically, the voltage on first bitline isolation line BIS0 and the voltage on second bitline isolation line BIS0* are transitioned to the first supply voltage VSS, thus effectively turning off transistors T0 and T1. Transistors T0 and T1 may, but are not required to, be turned off simultaneously.

$\tau 2$: The DRAM controller 101 enables the sense amplifier circuit 210. Specifically, the voltage on sensing activation line SAP transitions to the second supply voltage VDD, while the voltage on sensing activation line SAN transitions to the first supply voltage VSS. The voltage on sensing activation line SAP and the voltage on sensing activation line SAN may, but need not, be transitioned simultaneously. This triggers operation of the sense amplifier circuit 210, by virtue of which a positive feedback mechanism is carried out by transistors T5, T6, T7 and T8. As a result, there will be amplification of the potential difference between input/output nodes 321 and 323, with the voltage at input/output node 321 rising and the voltage at input/output node 323 falling. However, since transistors T0 and T1 have been turned off, the original (small) potential difference between left bitline BL(1) and right bitline BL(1)* does not change. After a certain amount of time, a considerable potential difference will develop between input/output nodes 321 and 323, whereas the potential difference between left bitline BL(1) and right bitline BL(1)* will still be at its original (small) value.

$\tau 3$: The isolator 230 is caused to re-connect left bitline BL(1) to input/output node 321, while right bitline BL(1)* remains isolated from input/output node 323. This is achieved through control of the isolator 230 by the DRAM controller 101. Specifically, the voltage on first bitline isolation line BIS0 is transitioned to the high positive voltage VPP, effectively turning on transistor T0. Meanwhile, the voltage on second bitline isolation line BIS0* remains at the first supply voltage VSS, thus keeping transistor T1 turned off. This leads to the following behavior:

In the case of left bitline BL(1) and input/output node 321: the voltage at input/output node 321 will drop somewhat during a transient phase while the voltage on left bitline BL(1) will rise somewhat during this period. Eventually, due to continued action of positive feedback in the sense amplifier circuit 210, the voltage at input/output node 321 will begin to increase again and tend towards the second supply voltage VDD, while the voltage on left bitline BL(1) will rise continually (although somewhat delayed relative to the voltage at input/output node 321) until it too converges to the second supply voltage VDD. This results in the second supply voltage VDD on left bitline BL(1) being applied across capacitor C(0) via transistor AT(0) (which is conducting), thereby effecting restoration of charge to memory cell MS(0,1), i.e., memory cell MS(0,1) is "refreshed".

In the case of right bitline BL(1)* and input/output node 323: the voltage at input/output node 323 will, if it had not already fallen to the first supply voltage VSS, decrease until this voltage is reached. Thereafter, the voltage at input/output node 323 will stay at this level, namely the first supply voltage VSS. Meanwhile, the voltage on right bitline BL(1)* will remain what it was prior to isolation of right bitline BL(1)* from input/output node 323, namely the bitline pre-charge voltage VBL.

It will thus be observed that the potential difference $\Delta V1$ between input/output node 321 and input/output node 323 exceeds the potential difference $\Delta V2$ between left bitline BL(1) and right bitline BL(1)*. The fact that $\Delta V2$ is less than $\Delta V1$ implies that less power is consumed by the sense amplifier SA(1). If power consumption is squarely proportional to voltage, then in this example, the power consumption will be around a quarter (¼) of that which would be consumed if bitlines BL(1) and BL(1)* were allowed to fully develop.

$\tau 4$: The row address decoder 113 de-activates wordline WL(0) (i.e., the voltage on wordline WL(0) transitions from the high positive voltage VPP to the first supply voltage VSS). This turns off transistor AT(0) forming part of memory cell MS(0,1). It is now safe to adjust the voltages on left bitline BL(1) and complementary bitline BL(1)* without fear of affecting the data content of memory cell MS(0,1).

τ5: The DRAM controller 101 de-activates sensing activation lines SAP, SAN. Specifically, the voltage on sensing activation lines SAP, SAN transitions to the bitline pre-charge voltage VBL. This quickly brings the voltage on input/output nodes 321 and 323 to VBL. Since transistor T0 remains conductive, the voltage on left bitline BL(1) is similarly brought to VBL, although with a slight delay due to line capacitance. Meanwhile, the voltage on right bitline BL(1)* does not change from its previous value, which is conveniently still VBL. Therefore, when the isolator 230 is caused to re-connect right bitline BL(1)* to input/output node 323 (which occurs at τ6), there will be no change to the voltage on complementary bitline BL(1)*. The sense amplifier 210 is now ready for another pre-charge operation.

Specific reference is now made to FIG. 3C, which is a timing diagram showing operation of the sense amplifier SA(1) of FIG. 2 during a refresh operation, following the aforementioned bitline pre-charge operation, and in accordance with another specific non-limiting embodiment of the present invention. The description begins under the assumption that the voltage on first bitline isolation line BIS0 and the voltage on second bitline isolation line BIS0* is at the high positive voltage VPP, thus initially placing transistors T0 and T1 in a conductive state.

τ0: The row address decoder 113 activates wordline WL(0) (i.e., the voltage on wordline WL(0) transitions from the first supply voltage VSS to the high positive voltage VPP). This turns on transistor AT(0) forming part of memory cell MS(0,1). As a result, charge sharing takes place between capacitor C(0) and left bitline BL(1). Meanwhile, the voltage on right bitline BL(1)* stays at the bitline pre-charge voltage VBL. As can be seen from FIG. 3C, a small potential difference between left bitline BL(1) and right bitline BL(1)* will develop. The sign of this potential difference (i.e., positive or negative) depends on the data value of memory cell MS(0,1). Since transistors T0 and T1 are in a conductive state, a small potential difference will also develop between input/output node 321 and input/output node 323.

τ1: The DRAM controller 101 activates sensing activation lines SAP, SAN. Specifically, the voltage on sensing activation line SAP transitions to the second supply voltage VDD, while the voltage on sensing activation line SAN transitions to the first supply voltage VSS. The voltage on sensing activation line SAP and the voltage on sensing activation line SAN may, but need not, be transitioned simultaneously. This triggers operation of the sense amplifier circuit 210, by virtue of which a positive feedback mechanism is carried out by transistors T5, T6, T7 and T8. The result will be amplification of the potential difference between input/output nodes 321 and 323, with the voltage at input/output node 321 rising and the voltage at input/output node 323 falling. Since transistors T0 and T1 remain conductive, the potential difference between left bitline BL(1) and right bitline BL(1)* increases as well, although with a slight lag due to the line capacitance.

τ2: The isolator 230 is caused to isolate left bitline BL(1) from input/output node 321 and to isolate right bitline BL(1)* from input/output node 323. This is achieved through control of the isolator 230 by the DRAM controller 101. Specifically, the voltage on first bitline isolation line BIS0 and the voltage on second bitline isolation line BIS0* are transitioned to the first supply voltage VSS, thus effectively turning off transistors T0 and T1. Transistors T0 and T1 may, but are not required to, be turned off simultaneously.

It is noted that isolation of left bitline BL(1) from input/output node 321 and isolation of right bitline BL(1)* from input/output node 323 occurs before the potential difference between left bitline BL(1) and right bitline BL(1)* has had a chance to fully develop (i.e., converge to its final values). However, isolation does not affect the behavior of the sense amplifier circuit 210 with respect to input/output nodes 321 and 323, and therefore the potential difference between input/output nodes 321 and 323 continues to grow, possibly even until it has converged to its final value (whereby, in this case, the voltage at input/output node 321 will be the second supply voltage VDD and the voltage at input/output node 323 will be the first supply voltage VSS).

τ3: The isolator 230 is caused to re-connect left bitline BL(1) to input/output node 321, while right bitline BL(1)* remains isolated from input/output node 323. This is achieved through control of the isolator 230 by the DRAM controller 101. Specifically, the voltage on first bitline isolation line BIS0 is transitioned to the high positive voltage VPP, effectively turning on transistor T0. Meanwhile, the voltage on second bitline isolation line BIS0* remains at the first supply voltage VSS, thus keeping transistor T1 turned off. This leads to the following behavior:

In the case of left bitline BL(1) and input/output node 321: the voltage at input/output node 321 will drop somewhat during a transient phase while the voltage on left bitline BL(1) will rise somewhat during this period. Eventually, due to continued action of positive feedback in the sense amplifier circuit 210, the voltage at input/output node 321 will begin to increase again and tend towards the second supply voltage VDD, while the voltage on left bitline BL(1) will rise continually (although somewhat delayed relative to the voltage at input/output node 321) until it too converges to the second supply voltage VDD. This results in the second supply voltage VDD on left bitline BL(1) being applied across capacitor C(0) via transistor AT(0) (which is conducting), thereby effecting restoration of charge to memory cell MS(0,1), i.e., memory cell MS(0,1) is "refreshed".

In the case of right bitline BL(1)* and input/output node 323: the voltage at input/output node 323 will, if it had not already fallen to the first supply voltage VSS, decrease until this voltage is reached. Thereafter, the voltage at input/output node 323 will stay at this level, namely the first supply voltage VSS. Meanwhile, the voltage on right bitline BL(1)* will remain what it was prior to isolation of right bitline BL(1)* from input/output node 323, namely an intermediate voltage between the bitline pre-charge voltage VBL and the first supply voltage VSS. In this illustrated example embodiment, the voltage on right bitline BL(1)* remains at a level that is about 50% of the way between VBL and VSS. (If VBL is midway between VSS and VDD, then clearly this represents a level that is 75% of the way between VDD and VSS.) Of course, other intermediate values are possible as the voltage reached by right bitline BL(1)* when transistor T1 is turned off.

It will thus be observed that the potential difference ΔV1 between input/output node 321 and input/output node 323 exceeds the potential difference ΔV3 between left bitline BL(1) and right bitline BL(1)*. In this case, ΔV3 is not as small as ΔV2 that had been previously obtained (in FIG. 3B) by isolating bitlines BL(1), BL(1)* from input/output nodes 321 and 323, respectively, prior to activating the sense amplifier circuit 210. Nevertheless, the fact that ΔV3 is still less than ΔV1 implies that less power is consumed by the sense amplifier SA(1). If power consumption is squarely proportional to voltage, then in this example, the power consumption will be around nine sixteenths (9/16) of that which would be consumed if bitlines BL(1) and BL(1)* were allowed to fully develop.

τ4: The row address decoder 113 de-activates wordline WL(0) (i.e., the voltage on wordline WL(0) transitions from the high positive voltage VPP to the first supply voltage VSS). This turns off transistor AT(0) forming part of memory cell MS(0,1). It is now safe to adjust the voltages on left bitline BL(1) and complementary bitline BL(1)* without fear of affecting the data content of memory cell MS(0,1).

τ5: The DRAM controller 101 de-activates sensing activation lines SAP, SAN. Specifically, the voltage on sensing activation lines SAP, SAN transitions to the bitline pre-charge voltage VBL. This quickly brings the voltage on input/output nodes 321 and 323 to VBL. Since transistor T0 remains conductive, the voltage on left bitline BL(1) is similarly brought to VBL, although with a slight delay due to line capacitance. Meanwhile, the voltage on right bitline BL(1)* does not change from its previous value, which is between VBL and VSS. Therefore, when the isolator 230 is caused to re-connect right bitline BL(1)* to input/output node 323 (which occurs at τ6), the voltage on complementary bitline BL(1)* will rise and reach VBL. The sense amplifier 210 is now ready for another pre-charge operation.

In an alternative embodiment, transistor T0 in the isolator 230 can remain conductive throughout the entire refresh operation. That is, rather than switch off transistor T0 at time τ1 (in FIG. 3B) or τ2 (in FIG. 3C) and switch it back on at time τ3, transistor T0 can remain turned on all along. This will provide comparable power savings benefits and performance, provided that any capacitive transients during switching off of transistor T1 do not significantly affect the performance of sense amplifier circuit 210. Specifically, in the case where transistor T0 is not switched off during the refresh operation, the values of ΔV1 as well as ΔV2 (FIG. 3B) and ΔV3 (FIG. 3C) will be the same as those in the case where transistor T0 was switched off, because these values are calculated when left bitline BL1 is in fact connected to input/output terminal 321.

Figure 5:
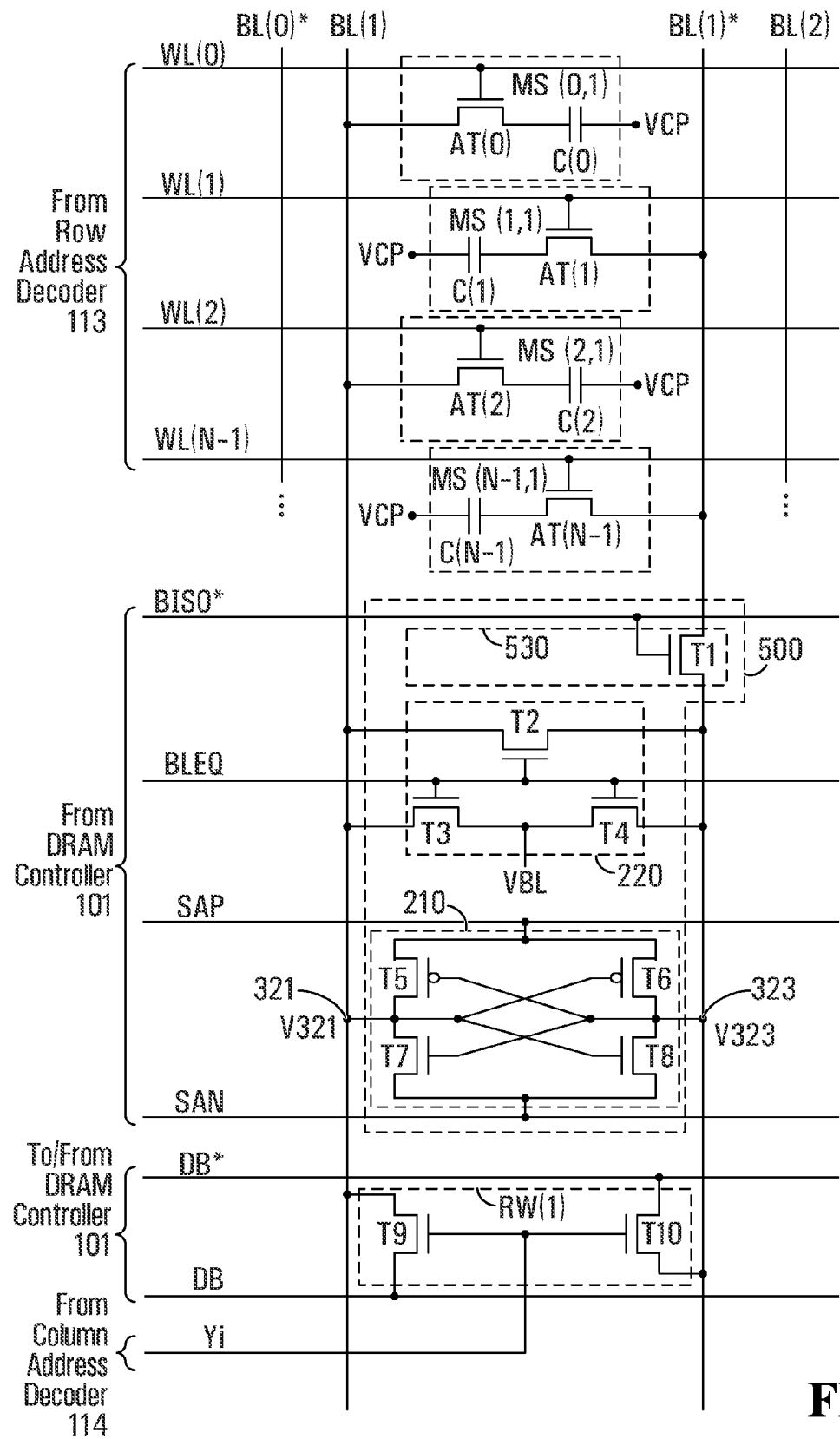
FIG. 5 is a block diagram illustrating an example of a sense amplifier, according to an alternative embodiment of the present invention.

Moreover, it is envisaged that transistor T0 may even be eliminated from the isolator 230. This is the case in FIG. 5, where sense amplifier 500 is seen to contain the same sense amplifier circuit 210 and bitline equalizer 220 as previously described with reference to sense amplifier SA(1). However, in this embodiment, an isolator 530 includes only transistor T1. A permanent electrical connection exists between left bitline BL(1) and input/output terminal 321. Consequently, the first bitline isolation line BIS0 can be dispensed with and only control of the second bitline isolation line BIS0* is required. The manner of controlling the signals is the same as described above with reference to FIGS. 3B and 3C, except that there is no first bitline isolation line BIS0 to manipulate. It will thus be appreciated that in such an embodiment, right bitline BL(1)* will be electrically disconnected from input/output terminal 323 while left bitline BL(1) remains electrically connected to input/output terminal 321.

Figure 4:
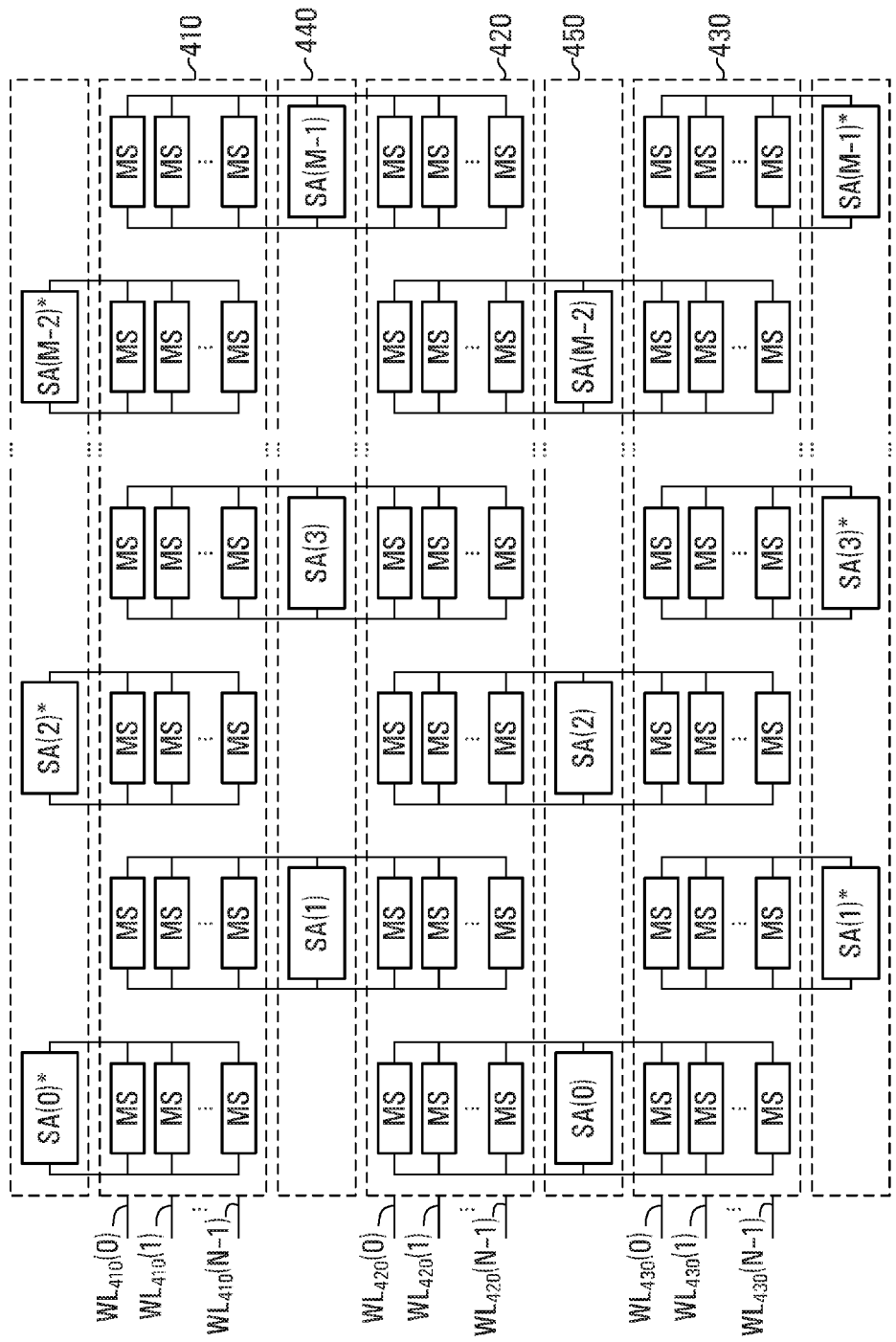
FIG. 4 is a block diagram illustrating an example of a DRAM device to which another embodiment of the present application is applicable.

In another embodiment, shown in FIG. 4, the memory array 102 is subdivided into a plurality of sub-arrays of rows and columns such that a particular memory cell in a given one of the memory sub-arrays is addressed by specifying its row and column within the given memory sub-array. By way of non-limiting example, reference numeral 410 shows a first memory sub-array, reference numeral 420 shows a second memory sub-array and reference numeral 430 shows a third memory sub-array. Of course, the total number of memory sub-arrays may be different (i.e., lesser or greater).

In the present non-limiting embodiment, memory sub-array 410, is addressed by a set of wordlines $WL_{410}(0)$, $WL_{410}(1)$, ... $WL_{410}(N-1)$, memory sub-array 420 is addressed by a set of wordlines $WL_{420}(0)$, $WL_{420}(1)$, ... $WL_{420}(N-1)$, and memory sub-array 430 is addressed by a set of wordlines $WL_{430}(0)$, $WL_{430}(1)$, ... $WL_{430}(N-1)$. In the present non-limiting embodiment, each of the memory sub-arrays 410, 420, 430 is assumed to have N rows and M columns of memory cells, but this need not be the case in all embodiments. For example, a given memory sub-array may have a greater or lesser number of rows, correspondingly requiring a greater or lesser number of wordlines.

In the specific embodiment of FIG. 4, the M sense amplifiers associated with a given memory sub-array can themselves be grouped into two (2) arrays of sense amplifiers. Considering memory sub-array 420 in particular, sense amplifiers SA(0), SA(2), ... , SA(M-2) form a lower sense amplifier array 450, while sense amplifiers SA(1), SA(3), ... , SA(M-1) form an upper sense amplifier array 440. Advantageously, the sense amplifiers in the upper sense amplifier array 450 can be re-used to connect to bitlines and memory cells in memory sub-array 410, while the sense amplifiers in the lower sense amplifier array 440 can be re-used to connect to bitlines and memory cells in memory sub-array 430. Therefore, even though M sense amplifiers are needed for a given memory sub-array, each of these M sense amplifiers is shared with a neighboring (upper or lower) memory sub-array (where one exists), and thus the total number of sense amplifiers can be kept to (M+1)/2 times the number of memory sub-arrays. Meanwhile, the capacitive load handled by a given sense amplifier does not increase, as it handles the left and right bitlines for only one of its neighboring memory sub-arrays at any given time, while remaining isolated from the other one of its neighboring memory sub-arrays.

As can be appreciated, in the embodiments above, where a pair of bitlines is associated with a given sense amplifier responsible for refreshing a given memory cell, the periods of time during which each of the bitlines is connected to (or isolated from) the corresponding input/output node of the sense amplifier are different. That is to say, during the time when the sense amplifier is carrying out its sensing operation (and the potential difference at the input/output nodes begins to increase), the one bitline in the pair that is connected to the memory cell being refreshed will be allowed to track the voltage of the corresponding input/output node of the sense amplifier, allowing the memory cell to be restored with the correct charge. However, the other bitline will be isolated from the corresponding input/output node of the sense amplifier during at least part of the sensing operation, which reduces the current flowing on that other bitline during the refresh operation, thereby consuming less power than if it had been allowed to continuously track the corresponding input/output node of the sense amplifier. Those skilled the art will appreciate that in this way, it may be possible to achieve reduced power consumption irrespective of the size of the memory array, the operating temperature or the refresh period.

In the embodiments described above, the manner in which device elements and circuits are shown as connected to each other is done for the sake of simplicity. In practical applications of the present invention, elements, circuits, etc. may be either connected directly to one another, or they may be connected indirectly to one another through other elements, circuits, etc., necessary for operation of devices and apparatus. Thus, in an actual configuration, the circuit elements and circuits described herein may be directly or indirectly coupled with or connected to one another.

It should also be appreciated that in some embodiments, all or part of the DRAM device can be manufactured based on a low-level hardware description obtained using a logic synthesis tool that is run on a computing device. The logic synthesis tool is configured to read source code containing a functional description of the DRAM device (e.g., in a language such as HDL, VHDL, Verilog) and to output a definition of the physical implementation of a circuit suitable for implementing corresponding functionality.

Additionally, although the above description has been provided in the context of a DRAM memory device, those skilled in the art may find that aspects of the invention apply to other memory types.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A semiconductor memory device, including:
a memory cell connected to a first bitline and associated with a second bitline;
a sense amplifier, including a first input/output node and a second input/output node; and
an isolator connected to the bitlines and to the input/output nodes, the isolator being configured to carry out bitline isolation during a refresh operation of the memory cell, wherein the bitline isolation includes:
electrically disconnecting the second bitline from the second input/output node, followed by:
electrically connecting the first bitline to the first input/output node while the second bitline remains electrically disconnected from the second input/output node,
the sense amplifier being responsive to receipt of at least one sensing activation signal from a controller to initiate a signal amplification process at the first and second input/output nodes;
the signal amplification process causing the first input/output node to tend towards a first final electric potential and the second input/output node to tend towards a second final electric potential different from the first final electric potential,
wherein electrically disconnecting the second bitline from the second input/output node is carried out after said amplification process has been initiated but before the second input/output node has reached the second final electric potential.

2. The semiconductor memory device defined in claim 1, wherein said isolator is further configured to electrically re-connect the second bitline to the second input/output node after the refresh operation is complete.

3. The semiconductor memory device defined in claim 1, further comprising said controller.

4. The semiconductor memory device defined in claim 3, wherein said controller is operative to cause the isolator to carry out said bitline isolation in response to detection of a command to perform a refresh operation.

5. The semiconductor memory device defined in claim 1, wherein electrically disconnecting the second bitline from the second input/output node is carried out before said signal amplification process has been initiated.

6. The semiconductor memory device defined in claim 1, wherein electrically disconnecting the second bitline from the second input/output node is carried out before the second input/output node has reached an electrical potential that is three-quarters of the way between the first final electric potential and the second final electric potential.

7. The semiconductor memory device defined in claim 6, further including a pre-charge circuit configured to pre-charge the first and second input/output nodes to a bitline pre-charge voltage that is between the first final electric potential and the second final electric potential.

8. The semiconductor memory device defined in claim 7, wherein the bitline pre-charge voltage is midway between the first final electric potential and the second final electric potential.

9. The semiconductor memory device defined in claim 7, wherein the controller is configured to pre-charge the first and second input/output nodes before sending causing the sense amplifier to initiate the signal amplification process at the first and second input/output nodes.

10. The semiconductor memory device defined in claim 7, wherein the memory cell includes a transistor connected between the first bitline and a capacitor, the transistor having a gate connected to a wordline activatable by the controller, the controller being configured to activate the wordline after pre-charging the first and second input/output nodes and before causing the sense amplifier to initiate the signal amplification process at the first and second input/output nodes, wherein activation of the wordline causes charge sharing between the capacitor and the first bitline.

11. The semiconductor memory device defined in claim 10, wherein at the time when the wordline is activated, the first bitline is electrically connected to the first input/output node and the second bitline is electrically connected to the second input/output node.

12. The semiconductor memory device defined in claim 11, wherein the controller is configured to pre-charge the first and second input/output nodes while the first bitline is electrically connected to the first input/output node and the second bitline is electrically connected to the second input/output node.

13. The semiconductor memory device defined in claim 7, wherein the at least one sensing activation signal is delivered from the controller to the sense amplifier over a first sensing activation line and a second sensing activation line, and wherein the controller is configured to set the first sensing activation line to the first final electric potential and to set the second sensing activation line to the second final electric potential in order to initiate the signal amplification process at the first and second input/output nodes.

14. The semiconductor memory device defined in claim 13, wherein the sense amplifier includes a first transistor, a second transistor, a third transistor and a fourth transistor, wherein each transistor has a gate, a source and a drain, wherein the source of the first transistor is connected to the drain of the second transistor, to the gates of the third and fourth transistors and to the first input/output node, wherein the source of the third transistor is connected to the drain of the fourth transistor, to the gates of the first and second transistors and to the second input/output node, wherein the drain of the first transistor is connected to the drain of the third transistor and the first sensing activation line and wherein the source of the second transistor is connected to the source of the fourth transistor and the second sensing activation line.

15. The semiconductor memory device defined in claim 14, wherein electrically disconnecting the second bitline from the second input/output node is carried out after said amplification process has been initiated but before the second input/output node has reached an electrical potential that is midway between the bitline precharge voltage and the second final electric potential.

16. The semiconductor memory device defined in claim 1, wherein the isolator includes:
   a first isolation element responsive to a first control signal to cause the first bitline to be electrically connected to or disconnected from the first input/output node; and
   a second isolation element responsive to a second control signal independent of the first control signal to cause the second bitline to be electrically connected to or disconnected from the second input/output node.

17. The semiconductor memory device defined in claim 16, wherein the first isolation element includes a first transistor and wherein the second isolation element includes a second transistor.

18. The semiconductor memory device defined in claim 17, wherein the first transistor includes a gate that receives the first control signal and wherein the second transistor includes a gate that receives the second control signal.

\* \* \* \* \*